(12) United States Patent
Dragt et al.

(10) Patent No.: US 9,964,564 B2
(45) Date of Patent: May 8, 2018

(54) SENSOR FOR MEASURING CURRENT IN A CONDUCTOR

(71) Applicant: EATON INDUSTRIES (NETHERLANDS) B.V., Hengelo (NL)

(72) Inventors: Johannes Dirk Gerrit Dragt, Enschede (NL); Elisabeth Johanna Maria Morskieft, Hengelo (NL)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days. days.

(21) Appl. No.: 15/314,101

(22) PCT Filed: May 26, 2015

(86) PCT No.: PCT/EP2015/061611
§ 371 (c)(1),
(2) Date: Nov. 28, 2016

(87) PCT Pub. No.: WO2015/181183
PCT Pub. Date: Dec. 3, 2015

(65) Prior Publication Data
US 2017/0153277 A1    Jun. 1, 2017

(30) Foreign Application Priority Data

May 28, 2014  (GB) .................................. 1409473.4

(51) Int. Cl.
*G01R 15/18*    (2006.01)
*G01R 15/14*    (2006.01)
*G01R 15/16*    (2006.01)

(52) U.S. Cl.
CPC ........... *G01R 15/142* (2013.01); *G01R 15/16* (2013.01); *G01R 15/181* (2013.01)

(58) Field of Classification Search
CPC .................................. G01R 1/20; G01R 1/22
(Continued)

(56) References Cited

U.S. PATENT DOCUMENTS 6,380,727 B1 *   4/2002  Jitaru ................... G01R 15/148
                                                              324/117 R
2003/0214313 A1   11/2003  Omura et al.
(Continued)

FOREIGN PATENT DOCUMENTS

CN        1335509 A       2/2002
DE    102010027130 A1    1/2012
(Continued)

*Primary Examiner* — Tung X Nguyen
(74) *Attorney, Agent, or Firm* — Leydig, Voit & Mayer, Ltd.

(57) ABSTRACT

A sensor for measuring current in a conductor has a substrate in the form of a stratified plate having a first metallization layer, a second metallization layer and an isolation layer between the first metallization layer and the second metallization layer, the substrate having a coil that winds along a coil axis parallel to the first metallization layer, having at least one winding. Each winding has a first track in the first metallization layer connected by a via through the first isolation layer to a second track in the second metallization layer, and the substrate has a measurer to measure the current in the coil, and having at least one winding only winding around non-magnetic material.

6 Claims, 2 Drawing Sheets

(58) Field of Classification Search
USPC .......................... 324/117 R, 117 H, 127, 126
See application file for complete search history.

(56) References Cited

U.S. PATENT DOCUMENTS

| | | | |
|---|---|---|---|
| 2007/0285089 A1* | 12/2007 | Ibuki | G01R 15/181 |
| | | | 324/260 |
| 2007/0296393 A1 | 12/2007 | Malpas et al. | |
| 2008/0246507 A1* | 10/2008 | Gunn | H02G 7/00 |
| | | | 324/764.01 |
| 2010/0301836 A1 | 12/2010 | Kern | |
| 2012/0019267 A1 | 1/2012 | Tabuchi | |
| 2014/0210463 A1 | 7/2014 | Klein | |

FOREIGN PATENT DOCUMENTS

| | | |
|---|---|---|
| JP | 2011185914 A | 9/2011 |
| JP | 2011220952 A | 11/2011 |
| WO | WO 2013034661 A1 | 3/2013 |
| WO | WO 2013138784 A1 | 9/2013 |

\* cited by examiner

SENSOR FOR MEASURING CURRENT IN A CONDUCTOR

CROSS-REFERENCE TO RELATED APPLICATIONS

This application is a U.S. national stage application under 35 U.S.C. § 371 of International Application No. PCT/EP2015/061611, filed on May 26, 2015, and claims benefit to British Patent Application No. 1 409 473.4, filed on May 28, 2014. The International Application was published in English on Dec. 3, 2015, as WO 2015/181183 A1 under PCT Article 21(2).

FIELD

The invention relates to a sensor for measuring current in a conductor comprising a substrate in the form of a stratified plate comprising a first metallization layer, a second metallization layer and an isolation layer between the first metallization layer and the second metallization layer.

BACKGROUND

WO2013/034661 describes a sensor for measuring current in a conductor without making contact to the conductor. A first and a second magnetic bar of the sensor are placed on opposite sides of a through hole of a PCB. The first and second magnetic bar are parallel. The conductor sticks through the through hole in the PCB. A measurement coil and an excitation coil are wound around the first magnetic bar. Similarly, a measurement coil and an excitation coil are wound around the second magnetic bar such that the measurement coil and the excitation coil are concentric. The excitation coils are fed by a supply so as to regularly saturate the corresponding magnetic bars. The coils are each formed by tracks in metallization layers of the PCB, connected by vias. The changes in the current in the conductor are determined by adding and subtracting the currents through the four coils.

When performing maintenance, the current through the conductor needs to be interrupted to remove the sensor and the conductor from each other. Other sensor for measuring current in a conductor is known from US2010/301836. It is an object of the invention to provide a sensor that at least partially solves this problem.

SUMMARY

An aspect of the invention provides a sensor for measuring current in a conductor, the sensor comprising: a substrate in form of a stratified plate including a first metallization layer, a second metallization layer, and an isolation layer between the first metallization layer and the second metallization layer; a voltage measurement capacitor; and an energy measurer configured to measure energy stored in the voltage measurement capacitor, wherein the substrate includes a coil that winds along a coil axis parallel to the first metallization layer, including at least one winding, wherein the at least one winding includes a first track in the first metallization layer connected by a via through the first isolation layer to a second track in the second metallization layer, wherein the substrate further includes a measurer configured to measure the current in the coil, wherein the at least one winding winds only around non-magnetic material, wherein the voltage measurement capacitor includes a first metallized area in the first metallization layer and a second metallized area in the second metallization layer, wherein the first metallized area and the second metallized area sandwich at least a part of the isolation layer between them.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
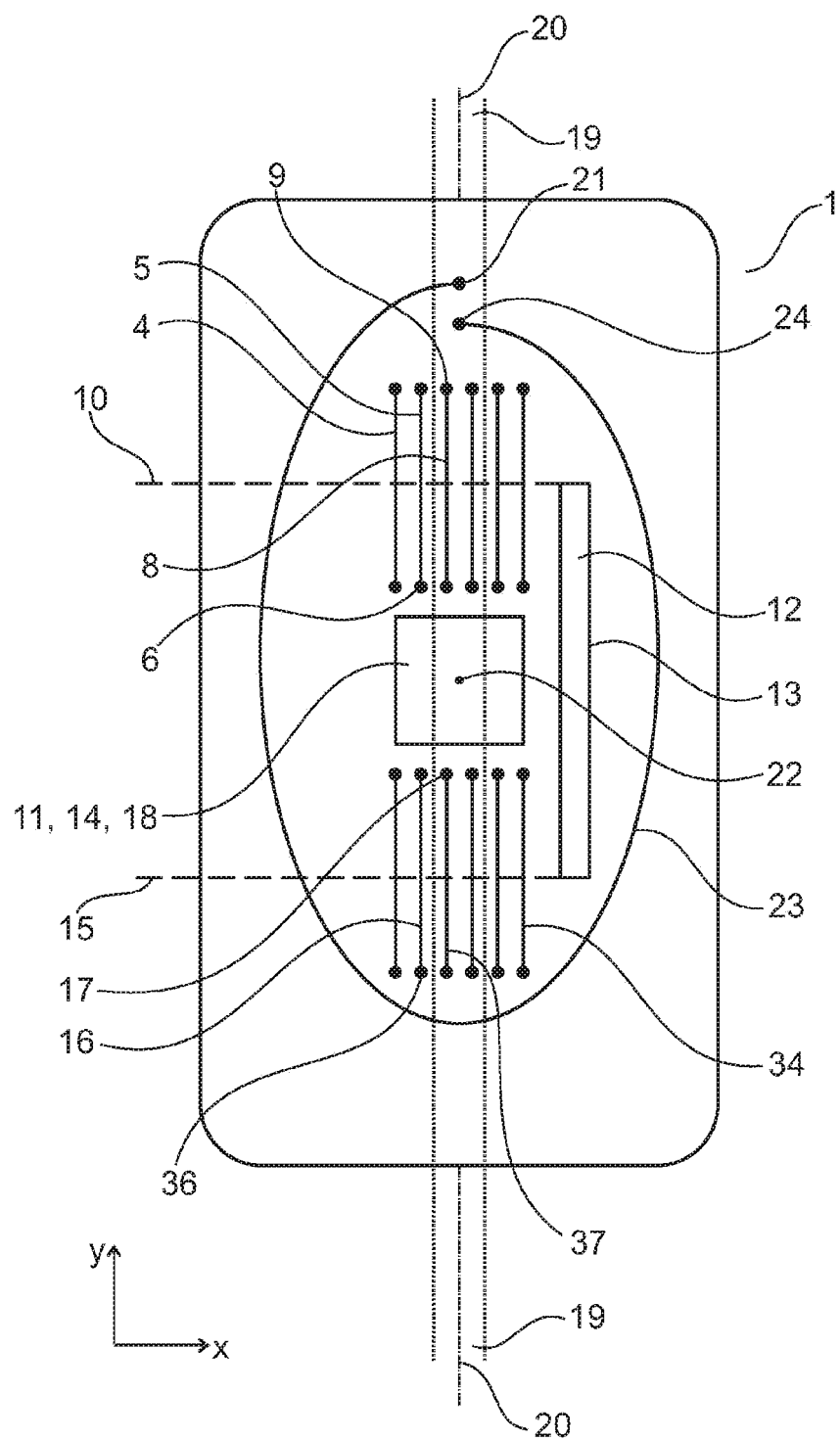
FIG. 1 sensor according to the invention.

According to the first embodiment of the invention there is provided a sensor for measuring current in a conductor, comprising a substrate in the form of a stratified plate comprising a first metallization layer, a second metallization layer and an isolation layer between the first metallization layer and the second metallization layer, the substrate comprising a coil that winds along a coil axis parallel to the first metallization layer, comprising at least one winding, wherein each winding comprises a first track in the first metallization layer connected by a via through the first isolation layer to a second track in the second metallization layer, and the substrate comprising means to measure the current in the coil, wherein the at least one winding only winds around non-magnetic material.

An aspect of the invention relates to a sensor for measuring current in a conductor, comprising a substrate in the form of a stratified plate comprising a first metallization layer, a second metallization layer and an isolation layer between the first metallization layer and the second metallization layer, the substrate comprising a coil that winds along a coil axis parallel to the first metallization layer, comprising at least one winding, wherein each winding comprises a first track in the first metallization layer connected by a via through the first isolation layer to a second track in the second metallization layer, and the substrate comprising means to measure the current in the coil.

By laws of physics, the coil is arranged to pick up the changing magnetic field of a current in the conductor running in a direction in the plane perpendicular to the coil axis. As the axis of the coil extends parallel to the first metallization layer, the conductor may run in such a direction in the plane perpendicular to the coil axis and does not have to pass through a hole in the substrate, i.e. it may run parallel to the metallization layer but perpendicular to the coil axis. Therefore the substrate and the conductor may be removed from each others neighborhood without having to interrupt the power through the conductor.

As the first track, the second track and the via form a winding, the skilled person will understand that the first track, the via and the second track are arranged such that a current that runs through the first track in a first direction and after passing the via through the second track in a second direction such that a first projection of the first direction on a cross-section plane perpendicular to the coil axis and a second projection of the second direction on the cross-section plane have opposite directions.

Forming the coil in such a way does not require new technology and can be applied on a broad scale at low costs. Moreover, by forming the coil in the stratified plate, the sensor can be kept small.

In addition, as the at least one winding is filled with non-magnetic material, the coil can measure a large variation in changes of magnetic fields without being limited by the material enclosed by the winding saturating. Therefore an excitation coil is not necessary and a power supply for supplying the excitation coil is also not necessary. This means that the sensor can be easily constructed, can be small and requires little power.

The non-magnetic material preferably could comprise a fiber-glass and epoxy compound, a ceramic material, or a polyimide material.

According to a second embodiment of the invention, there is provided the sensor according to the first embodiment, wherein the substrate is a printed circuit board.

Printed circuit board can be made and processed with well available technologies.

According to a third embodiment of the invention, there is provided the sensor according to the first or second embodiment, comprising a voltage measurement capacitor comprising a first metallized area in the first metallization layer and a second metallized area in the second metallization layer, the first metallized area and the second metallized area sandwiching a part of the isolation layer between them and the sensor comprising means for measuring the energy stored in the voltage measurement capacitor.

As the first metallized area and the second metallized area sandwich a part of the isolation layer between them, they form a capacitor that is arranged to pick up the electrical field from a conductor that runs in a direction parallel to the metallization layer. This also encompasses the conductor running perpendicular to the coil axis, which means that the sensor can be used to measure both the current and the voltage of the current without having to change the relative orientations of the sensor and the conductor.

In a preferred embodiment, the energy stored in the voltage measurement capacitor is measured by measuring the voltage over the voltage measurement capacitor.

According to a fourth embodiment of the invention, the substrate comprises a wireless transmitter for wirelessly transmitting measured values of the current in the coil or measured values of the energy stored in the voltage measurement capacitor.

By wirelessly transmitting measured values, the sensor can communicate wirelessly which makes the sensor safe to use in high voltage distribution systems or low voltage distribution systems.

The wireless transmitter can for example transmit the measured values by optical means or by radio frequency means. In case radio frequency means are used, the power coil could be used as antenna, or a separate coil could be arranged on the substrate.

In case the sensor is according to the third embodiment and the wireless transmitter is arranged to transmit both the measured values of the current in the coil and the measured values of the energy stored in the voltage measurement capacitor, the sensor can communicate wirelessly, this advantage is maintained for a sensor that is arranged to measure both the current and the voltage through a conductor wirelessly and without reorientation between the current and voltage measurements.

According to a fifth embodiment of the invention, there is provided a sensor according to any of the preceding embodiments, wherein the substrate comprises a power pickup circuit arranged to inductively pick up power, the power pickup circuit comprising a further coil that winds along a further coil axis perpendicular to the first metallization layer and comprising means to supply picked up power to the sensor.

In this orientation of the further coil, the further coil is arranged to pick up power from a conductor of an external power supply system. Because for inductive pick up of power, electrical contact is not necessary and the sensor can be supplied with power without having to connect it. This contributes to safety when the sensor is used in a high voltage distribution system or a low voltage distribution system.

According to a sixth embodiment of the invention, there is provided a sensor according to the fifth embodiment, wherein the further coil comprises at least one further winding, wherein each further winding comprises a further first track in the first metallization layer connected by a further via through the first isolation layer to a further second track in the second metallization layer.

As further coil winds along the further coil axis perpendicular to the first metallization layer and the further via connects the first further track and the second further track in a direction perpendicular to the first metallization layer, the skilled person will understand that the first further track and the second further track together may form a single further winding, or part of a single winding, or may each form a winding apart from the further vias connecting the windings.

Forming the further coil in such a way does not require new technology and can be applied on a broad scale at low costs.

Moreover, by forming the further coil in the stratified plate, the sensor can be kept small.

The sensor according to the invention could furthermore be provided with a temperature sensor, to compensate the measured values based on the current temperature. This will increase the accuracy of the sensor of the invention.

As used herein, "metallization layer" is used for a layer on the stratified plate in which one or more conductive tracks are made, electrically connecting different electrical components to each another. Generally, the metallization layer is obtained by depositing a uniform layer of a conductive material, typically a metal such as copper, and then etching this uniform layer to allow only the conductive tracks to remain.

As used herein, "non-magnetic material" is used for a material with a very low magnetic susceptibility, for instance a material having a permeability $\mu$ being lower than $1.0 \times 10^{-4}$ H/m As used herein, "low voltage systems" are systems that are used downstream of a power supply in an electrical power grid that typically are arranged to handle voltages up to 1000 V AC or 1500 V DC. An example of a module for such a low voltage system is a motor starter.

As used herein, "high voltage systems" are systems that fall outside of the definition of "low voltage systems".

Examples of embodiments the invention will now be described with reference to the accompanying schematic drawings. Corresponding reference symbols in the schematic drawings indicate corresponding parts. The schematic drawings are not necessarily to scale and certain features may be exaggerated to better illustrate and explain the present invention. Further, the examples are not intended to be exhaustive or otherwise limit or restrict the invention to the precise configurations shown in the drawings and disclosed in the following detailed description.

For the purpose of explaining the invention, use is made of an x-direction, a y-direction and a z-direction, which are all perpendicular and chosen in right-handed orientation. A corresponding Cartesian coordinate system is used as well.

A sensor (1) according to an embodiment of the invention comprises a printed circuit board (PCB) (2). The PCB is formed as a stratified plate with layers stacked in the z-direction. The side of the PCB (2) with the largest z-coordinate is herein referred to as the topside of the PCB (2), the side of the PCB (2) with the smallest PCB (2) as the bottom side of the PCB (2). A top view of the sensor (i.e. a view in negative z-direction) is shown in FIG. 1.

The PCB (2) comprises an isolation layer (3) of non-magnetic material such as fiberglass or epoxy resin, a ceramic material or a polyimide material. In this example the non-magnetic material is an epoxy resin.

The PCB (2) comprises a coil (4) which is formed by printed tracks and vias. A first plurality of conductive, straight, parallel tracks is formed in a first metallization layer on the topside of the PCB (2). The conductive tracks are formed from Copper. Copper is a non-magnetic material. Each track of the first plurality of conductive tracks is rectangular and extends along the y-direction from a first y-coordinate to a second y-coordinate.

Figure 2:
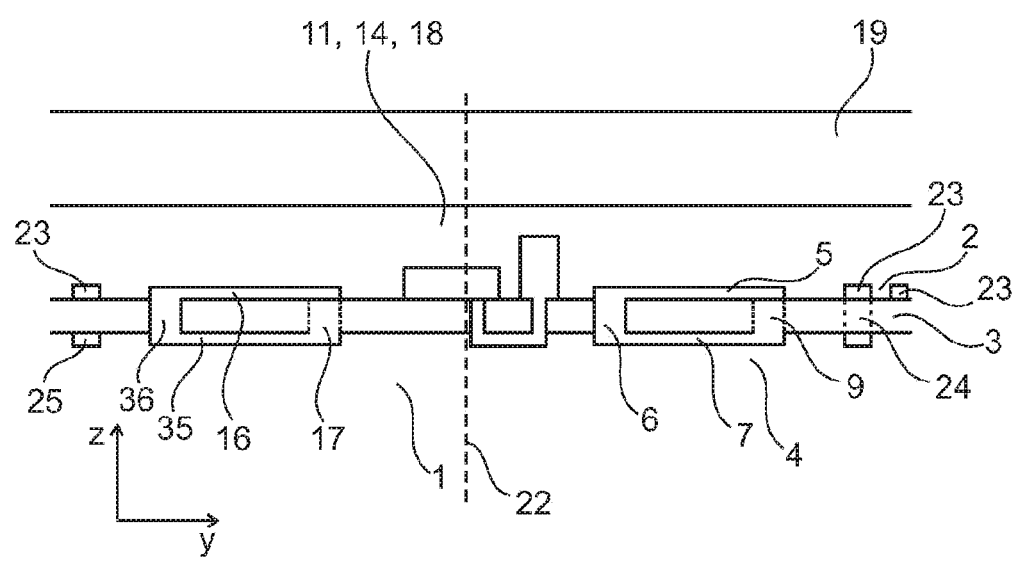
FIG. 2 cross section of a sensor according to the invention.

A first winding of the coil is further described in more detail. The first winding comprises a first track (5) of the first plurality of tracks. The first winding further comprises a via (6) which connects the first track at the first y-coordinate to a second track (7) of a second plurality of tracks in a second metallization layer on the bottom side of the PCB (2). The via (6) and the second track (7) are shown in FIG. 2.

Neglecting intermediate vias, the second track (7) connects the first track (7), which is at a first x-coordinate, to a third track (8), which is at a second x-coordinate. The first track (7) and the third track (8) are adjacent in the first metallization layer. The connection between the second track (7) and the third track (8) is made by an additional via (9) at the second y-coordinate. The additional via (9) is shown in dotted lines in FIG. 2 to indicate its direction although it is not present at the x-coordinate at which the cross section is made. The additional via (9) is shown only for the purpose of explaining the invention and to show how a winding is comprised in the PCB (2).

The configuration of the first winding is repeated to form a coil (4) with multiple windings that wind along a coil axis (10). This coil axis is parallel to the first and second metallization layer and parallel to the x-axis.

The PCB (2) further comprises means (11) to measure the current in the coil (4). The means (11) are connected to the outmost windings of the coil (4). These means are for example an analog to digital converter, with which the current in the coil can be derived.

In use a conductor (19) is situated proximate to the sensor (1) such that it extends parallel to the y-direction. The conductor (19) is symmetric around an axis of symmetry (20). The axis of symmetry (20) is part of a plane of symmetry perpendicular to the x-axis. This plane of symmetry divides the coil (4) in two symmetric halves so that the coil (4) is most sensitive to changes in the magnetic field caused by changes in current over the conductor (19).

The PCB (2) also comprises a first metallized area (12) in the first metallization layer and a second metallized area in the second metallization layer. The first metallized area (12) has a first contour (13) and the second metallized area has a second contour. The projection of the first contour (13) of the first metallized area (12) in the z-direction (i.e. through the isolation layer (3)) onto the second metallization layer forms the second contour. This means that the isolation layer (3) is sandwiched between the first metallized area (12) and the second metallized area. Therefore a capacitor is formed, here referred to as voltage measurement capacitor. The voltage over this voltage measurement capacitor varies with the electric field corresponding to the voltage of the conductor (19).

The first metallized area (12) and the second metallized area are connected to means (14) to measure a voltage difference between the first metallized area (12) and the second metallized area. In FIG. 1 and FIG. 2, the means (14) to measure a voltage difference between the first metallized area (12) and the second metallized area and the means (11) for measuring the current in the coil (4) are schematically represented to occupy a combined area on the PCB (2).

The PCB (2) further comprises a wireless transmitter (18) arranged to transmit the value of the measured current in the coil (4) or the value of the measured voltage difference in the voltage measurement capacitor.

In FIG. 1 and FIG. 2, the means (14) to measure a voltage difference between the first metallized area (12) and the second metallized area and the means (11) for measuring the current in the coil (4) as well as the wireless transmitter (18) are schematically represented to occupy a combined area on the PCB (2). The means may for instance comprise surface mount components (SMD) such as capacitors and resistors, and IC's, antenna's etcetera.

The PCB (2) also comprises a further coil (21) that winds around a further coil axis (22) that extends in the z-direction. The further coil comprises a further first track (23) in the first metallization layer (FIG. 1). The further first track (23) is curved around the coil (4), the means (11) for measuring the current in the coil (4), the means (14) to measure the voltage in the voltage measurement capacitor, the voltage measurement capacitor itself as well as the wireless transmitter (18). The further first track is connected by a further via (24) to a further second track (25) in the second metallization layer. In the second metallization layer, the further second track (25) also curves around the coil (4), the means (11) for measuring the current in the coil (4), the means (14) to measure the voltage in the voltage measurement capacitor, the voltage measurement capacitor itself and the wireless transmitter (18). The further second track (25) is arranged such that the further first track (23), the further via (24) and the further second track together form the further coil (21).

The PCB (2) also comprises an additional coil (34) that winds around an additional coil axis (15) parallel to the coil axis (10). The additional coil (34) is similar to the coil (4). The additional coil (34) comprises an additional first track (16) in the first metallization layer. The additional first track (16) is connected by an intermediate via (36) to an additional second track (35) in the second metallization layer on the bottom side of the PCB (2). Neglecting vias, the additional second track (35) connects the additional first track (16) to an additional third track (37) in the first metallization layer. The additional first track (16) is at the first x-coordinate, the additional third track (37) is at the second x-coordinate.

The material of the tracks (16, 35, 37) in the additional coil (34) is Copper. The additional coil (34) is connected in series with the coil to increase signal strength. By the placing relatively short coil (4) and additional coil (34), the PCB (2) dimension in x-direction remains relatively small.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

The invention claimed is:

1. A sensor for measuring current in a conductor, the sensor comprising:
   a substrate in the form of a stratified plate including a first metallization layer, a second metallization layer, and an isolation layer between the first metallization layer and the second metallization layer;
   a voltage measurement capacitor; and
   an energy measurer configured to measure energy stored in the voltage measurement capacitor,
   wherein the substrate includes a coil that winds along a coil axis parallel to the first metallization layer, including at least one winding,
   wherein the at least one winding includes a first track in the first metallization layer connected by a via through the first isolation layer to a second track in the second metallization layer,
   wherein the substrate further includes a measurer configured to measure current in the coil,
   wherein the at least one winding winds only around non-magnetic material,
   wherein the voltage measurement capacitor includes a first metallized area in the first metallization layer and a second metallized area in the second metallization layer,
   wherein the first metallized area and the second metallized area sandwich at least a part of the isolation layer between them.

2. The sensor of claim 1, wherein the substrate is a printed circuit board.

3. The sensor of claim 1, further comprising:
   a wireless transmitter configured to wirelessly transmit one or more measured values of the current in the coil or one or more measured values of the energy stored in the voltage measurement capacitor.

4. A sensor for measuring current in a conductor, the sensor comprising:
   a substrate in the form of a stratified plate including a first metallization layer, a second metallization layer, and an isolation layer between the first metallization layer and the second metallization layer;
   a voltage measurement capacitor; and
   an energy measurer configured to measure energy stored in the voltage measurement capacitor,
   wherein the substrate includes a coil that winds along a coil axis parallel to the first metallization layer, including at least one winding,
   wherein the at least one winding includes a first track in the first metallization layer connected by a via through the first isolation layer to a second track in the second metallization layer,
   wherein the substrate further includes a measurer configured to measure current in the coil,
   wherein the at least one winding winds only around non-magnetic material,
   wherein the voltage measurement capacitor includes a first metallized area in the first metallization layer and a second metallized area in the second metallization layer,
   wherein the first metallized area and the second metallized area sandwich at least a part of the isolation layer between them,
   wherein the substrate includes a power pickup circuit arranged to inductively pick up power,
   wherein the power pickup circuit includes a further coil that winds along a further coil axis perpendicular to the first metallization layer, and
   wherein the power pickup circuit includes a power supplier configured to supply picked up power to the sensor.

5. The sensor of claim 4, wherein the further coil includes a further winding,
   wherein each further winding includes a further first track in the first metallization layer connected by a further via through the first isolation layer to a further second track in the second metallization layer.

6. The sensor of claim 1, wherein the at least one winding includes a plurality of windings.

* * * * *